United States Patent [19]

Yokogawa

[11] Patent Number: 4,866,691
[45] Date of Patent: Sep. 12, 1989

[54] AC AMPLIFYING RF SIGNAL PROCESSING CIRCUIT FOR OPTICAL DISK PLAYER

[75] Inventor: Fumihiko Yokogawa, Saitama, Japan

[73] Assignee: Pioneer Electronic Corporation, Tokyo, Japan

[21] Appl. No.: 166,938

[22] Filed: Mar. 11, 1988

[30] Foreign Application Priority Data

Mar. 13, 1987 [JP] Japan .................................. 62-59748
Jun. 17, 1987 [JP] Japan ................................ 62-150590
Sep. 16, 1987 [JP] Japan ................................ 62-231747

[51] Int. Cl.$^4$ .......................... G11B 7/00; H04N 5/76
[52] U.S. Cl. ..................................... 369/48; 358/342; 358/160; 369/59; 369/60; 360/67; 360/32; 360/33.1
[58] Field of Search ....................... 358/335, 342, 160; 360/32, 33.1, 67; 369/48, 59, 60

[56] References Cited

U.S. PATENT DOCUMENTS 4,630,231 12/1986 Hirata et al. .................... 358/342 X
4,680,647 7/1987 Moriyama ....................... 358/342 X Primary Examiner—Robert L. Richardson
Attorney, Agent, or Firm—Sughrue, Mion, Zinn, Macpeak & Seas

[57] ABSTRACT

An RF signal processing circuit for processing an RF signal read from an optical disk or the like in which the entire dynamic range of an A/D converter circuit used to digitize the RF signal. An edge detector circuit detects the edges of the amplified RF signal, and a synchronizing signal detector detects a synchronizing signal in correspondence to the output of the edge detector. A timing signal is produced in correspondence to the output of the synchronizing signal detecting circuit. A clamping circuit clamps the input of the edge detector at a predetermined voltage in correspondence to the timing signal, whereby the input of the edge detector is clamped for at least a portion of the time period to the synchronizing signal.

4 Claims, 6 Drawing Sheets

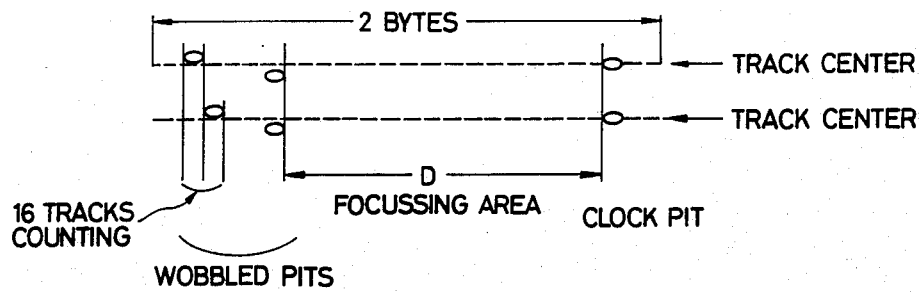
FIG. 1
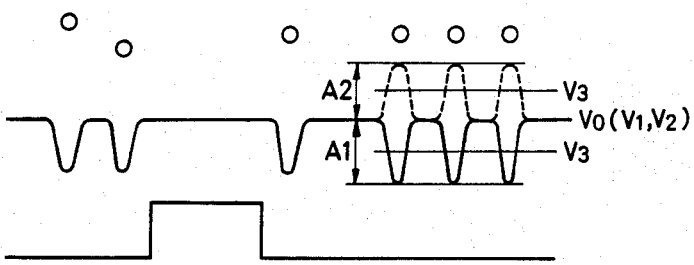
FIG. 3(A)
FIG. 3(B)
FIG. 3(C)
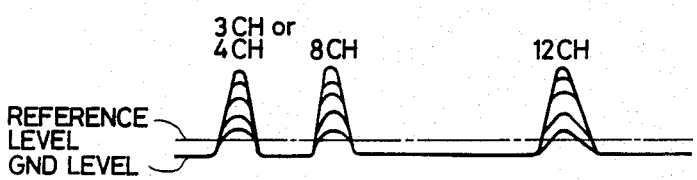
FIG. 4(A)
FIG. 4(B)
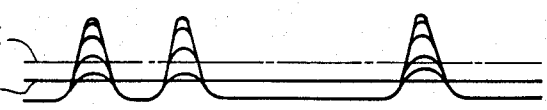
FIG. 4(C)
FIG. 4(D)

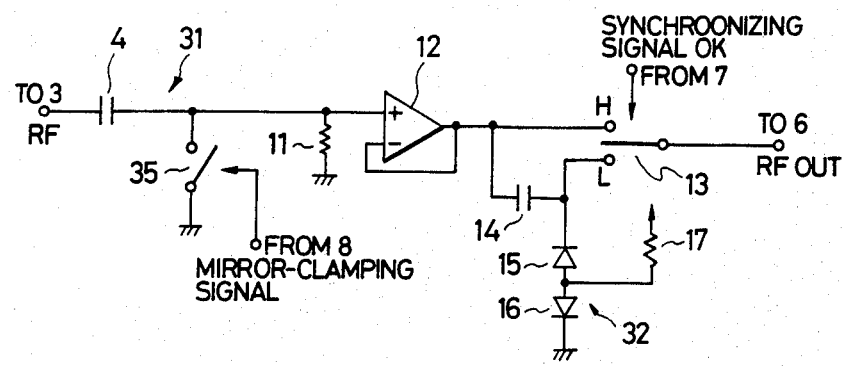
FIG. 5
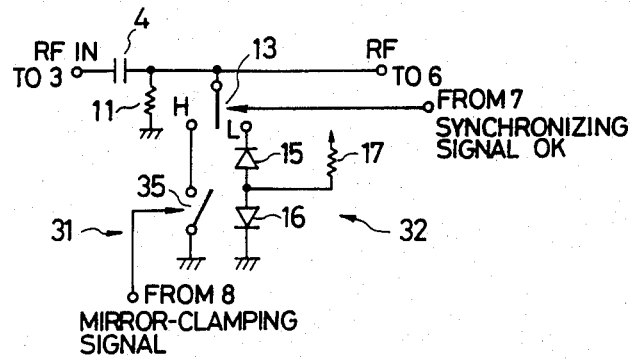
FIG. 6
FIG. 7
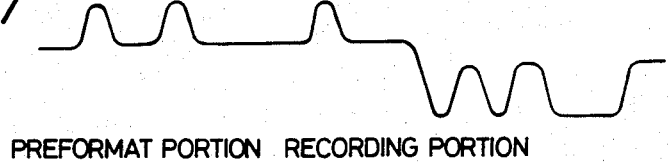
FIG. 8(A)
FIG. 8(B)
FIG. 8(C)
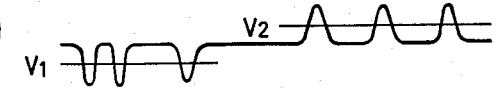

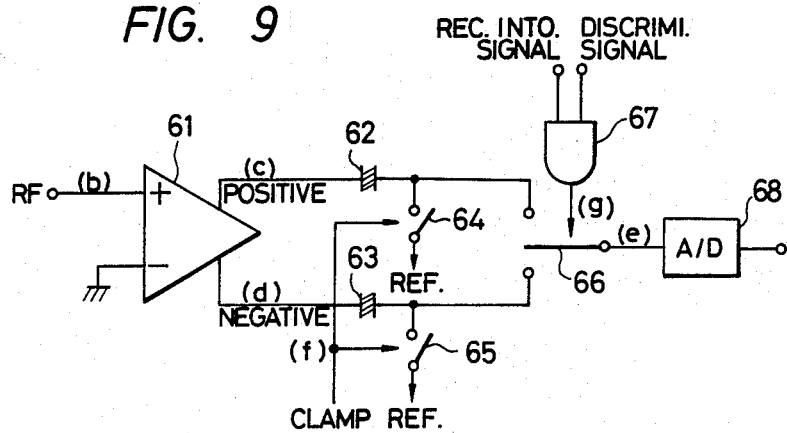
FIG. 9

FIG. 10(B)

FIG. 10(E) $v_1$ 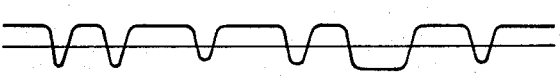

AC AMPLIFYING RF SIGNAL PROCESSING CIRCUIT FOR OPTICAL DISK PLAYER

BACKGROUND OF INVENTION

The present invention relates to an RF signal processing circuit for processing RF signals from the tracks of an optical disk.

As used herein, and as widely employed and understood within the relevant art, the term "RF signal" indicates the electrical output signal from an optical pickup or the like which senses recorded patterns on an optical disk.

FIG. 1 shows recorded patterns on the tracks of an optical disk. Each sector of the optical disk includes plural servo blocks (e.g., 43 servo blocks). The sector includes a preformat portion composed of a servo-byte of two bytes and a recording portion succeeding thereto composed of a data-byte of 16 bytes. The servo-byte includes a clock pit and two wobbled pits located to the right and left with respect to the center of the track.

When a pickup (that is, a beam spot for detecting information) traces the center of the tracks with no deviation, no difference occurs in the light intensities reflected from the two wobbled pits. On the other hand, when the pickup deviates to the right or left from the center of the track, a difference corresponding to the direction and distance of the deviation occurs between the light intensities reflected from the wobbled pits. Accordingly, a tracking error signal can be produced by detecting the difference between the reflected light intensities from the two positions (two wobbled pits), that is, by detecting the level difference between the RF signals from the two wobbled pits. The tracking error signal thus produced is held for the period during which a databyte succeeding the servo-byte is read out. The respective pairs of wobbled pits are arranged in such a manner that longer and shorter intervals thereof are alternately repeated every 16 tracks so that, by detecting variations in these intervals, the number of tracks can be accurately counted (16 tracks), even if the pickup searches the tracks at high speed.

The distance D between the clock pit and the one of the two wobbled pits closer to the clock pit is set to a length which does not exist in the data-byte. Therefore, the distance D is useful for producing a synchronizing signal. For example, a pre-pit portion including a first pit portion for tracking and a second pit portion for producing a synchronizing signal can be provided in the servo-byte area. The second pit portion contains a first byte of an eight-channel pit and second byte of a 12-channel pit, the distance therebetween being set to a 19-channel clock. The data-byte area is less than an 18-channel clock in length, and therefore the second pit portion having the interval of the 19-channel clock can be detected as a synchronizing signal.

Various timing signals are produced on the basis of the synchronizing signal, and a clock signal is generated in response to a detection signal of the clock pit.

The mirror-surface portion having the length of D is called the focusing area, and is used for producing a focus error signal which is held for a period when information from the succeeding data-byte is read out.

Such pits as described above are formed in each servo-byte area. Data required by the user are recorded in a data-byte area (recording area) succeeding the servo-byte area with pit patterns or with phase-variations or the like.

In the case where the data are recorded in the form of a pit pattern, the output RF signal from the pickup drops in level in positions where pits are formed. On the other hand, in the case where the data are recorded using a phase-variation technique, the level of the RF signal is increased in recorded positions corresponding to the positions where pits are formed for some recording materials. For recording or reproducing data in both types of disks described above, a DC amplifier having a broad bandwidth must be used to amplify the RF signal because the potential of the servo-byte area is unstabilized.

However, such a DC amplifier of broad bandwidth has disadvantages in that its noise level is inherently high, drift variations with respect to changes of temperature easily occur, and the cost is high.

SUMMARY OF THE INVENTION

Overcoming the above and other disadvantages, the invention provides an RF signal processing circuit comprising an amplifying circuit for amplifying the RF signal read from an optical disk or the like, an edge detector circuit for detecting edges in the output signal from the amplifying circuit, a synchronizing signal detector circuit for detecting a synchronizing signal in correspondence to the output of the edge detector circuit, a timing signal producing circuit for producing a timing signal in correspondence to the output of the synchronizing signal detector circuit, and a clamping circuit for clamping the input of the edge detector at a predetermined voltage in correspondence to the output of the timing signal producing circuit, with the input of the edge detector circuit being clamped for at least a portion of the period of time during which the synchronizing signal is present.

In accordance with another aspect of the present invention, there is provided an RF signal processing circuit comprising an amplifying circuit for amplifying the RF signal read from a recording medium, such as an optical disk, having a preformat portion and a recording portion, the amplifying circuit producing both in-phase and inverted-phase output signals, a clamping circuit for clamping either the input or output of the amplifying circuit to a reference potential in response to the timing of the preformat portion, switching means for selecting as its output one of the in-phase and inverted-phase signals with the choice being such that the polarity of the RF signal in the recording portion is made to agree with the polarity of the RF signal in the preformat portion, a control signal producing circuit for producing a control signal for operating the switching means in the abovedescribed manner, and A/D converter for digitizing the RF signal output by the switching means.

In accordance with still another aspect of the invention, there is provided an RF signal processing circuit comprising a first clamping circuit for clamping a predetermined region of the synchronizing signal containing in the RF signal to a predetermined voltage, a second clamping circuit for clamping the minimum or maximum level of the RF signal to another predetermined voltage, and switching means for selecting as its output the first clamping circuit when the synchronizing signal is detected and the output of the second clamping circuit when the synchronizing signal is not detected.

BRIEF DESCRIPTION OF THE DRAWINGS

FIG. 1 a diagram showing the pattern of pits recorded on the surface of an optical disk;

FIGS. 3(A) to 3(C) are diagrams showing pits recorded on an optical disk and signal produced in response to the reproduction of this region of the disk;

FIGS. 4(A) to 4(D) are wave diagrams showing waveforms in the embodiment of FIG. 2;

FIG. 5 is a block diagram of a second embodiment of an RF signal processing circuit of the invention;

FIG. 6 is a block diagram of a third embodiment of an RF signal processing circuit of the invention;

FIG. 7 shows a waveform of an RF signal processed in the circuit of FIG. 5;

FIGS. 8(A) to 8(C) are diagram as similar to FIG. 3 and used to explain how the dynamic range of an A/D converter for digitizing the RF signal read from an optical disk is used;

FIG. 9 is a block diagram of a fourth embodiment of an RF signal processing circuit of the invention;

FIGS. 10(A) to 10(G) show the waveforms of signals at various points in the circuit of FIG. 9;

DESCRIPTION OF THE PREFERRED EMBODIMENTS

Figure 2:
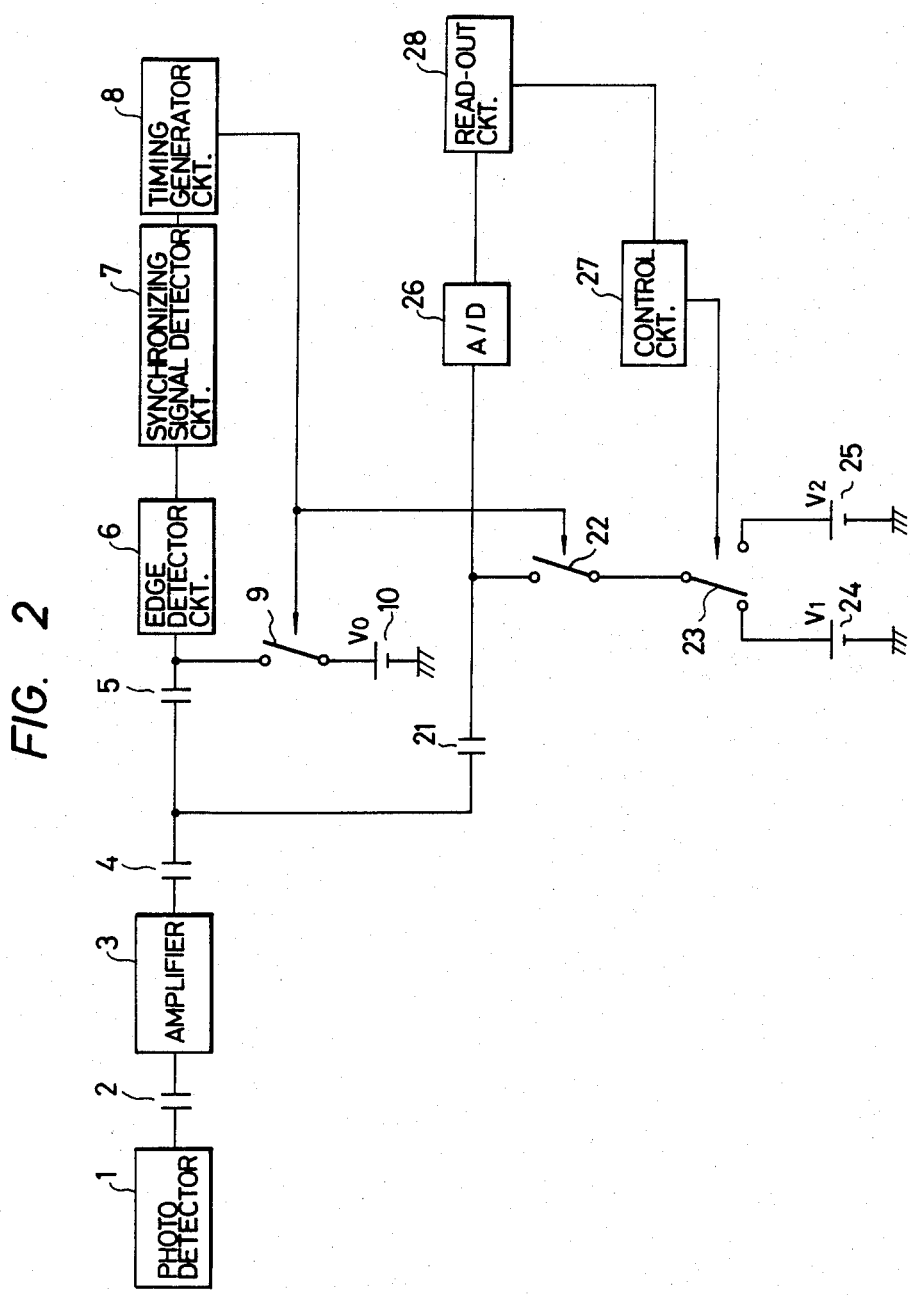
FIG. 2 is a block diagram of an RF signal processing circuit constructed according to a first embodiment of the invention.

FIG. 2 is a block diagram of an RF signal processing circuit constructed according to a first embodiment of the invention.

Reference numeral 1 designates a photodetector for detecting light reflected from an optical disk. RF signals outputted from the photodetector 1 are applied through a capacitor 2 to an amplifier 3 and there subjected to AC amplification. The RF signal thus amplified is applied through capacitors 4 and 5 to an edge detector circuit 6. The level of the RF signal drops when wobbled pits or clock pits are encountered in servo-byte areas as shown in FIG. 3(A). The variation of the RF signal as described above is shown in FIG. 3(B). The edge detector circuit 6 differentiates the RF signal inputted thereto and detects the zero-crossing points of the differentiated RF signal, thereby detecting the central positions (edges) of the pits and to output a detection signal in response to the edges. This detection signal is inputted to a synchronizing signal detector circuit 7. The synchronizing signal detector circuit 7 recognizes that a synchronizing area located between a rearward wobbled pit and a clock pit has a longest length which cannot be present in any data-byte area, thereby to detect this area and to produce a synchronizing signal. The synchronizing signal is applied to a timing generator circuit 8 which produces various timing signals on the basis of the synchronizing signal. The timing generator circuit 8 provides switches 9 and 22 with a timing signal corresponding to at least a part of the above area (the synchronizing signal), as shown in FIG. 3(C). The switch 9 is kept in the ON state for the period when the timing signal is inputted to the switch 9, whereby the input of the edge detector circuit 6 is clamped to a predetermined potential $V_0$ which is supplied by a reference voltage generator circuit 10. That is, the switch 9 and the reference voltage generator circuit 10 constitute a clamping circuit.

As described above, the RF signal inputted to the edge detector circuit 6 is clamped to the predetermined potential $V_0$ in every synchronizing area of each servo block. Thus, the edge detector circuit 6 can accurately detect the edges of the pits, that is, the synchronizing signal detector circuit 7 can accurately detect the synchronizing signals.

Further, the switch 22 is also kept in the ON state for periods when the timing signal is provided thereto. Thus, the input of an A/D converter circuit 26 is clamped to one of predetermined reference potentials $V_1$ and $V_2$ supplied by reference voltage generator circuit 24 and 25, respectively, in at least a part of the synchronizing area of each servo-byte area.

A control circuit 27, inclusive of a microcomputer, etc., discriminates the type of disk on the basis of a discriminating code read by a read-out circuit 28. The switch 23 is operated so as to select the reference potential $V_1$ for a first type of disk in which the level of the RF signal is lowered in data recording portions and select the reference potential $V_2$ for a second type of disk in which the level of the RF signal increases in the data recording portion. The reference potentials $V_1$ and $V_2$ are set to the following values:

$$V_1 = V_3 + A_1/2, \quad V_2 = V_3 - A_2/2,$$

where $V_3$ represents a reference potential of the A/D converter circuit 26, and $A_1$ and $A_2$ represent amplitudes of level changes of the RF signal in each data-byte area for the first and second type of disks, respectively. As a result, the centers of the amplitudes $A_1$ and $A_2$ are constantly set to the reference potential $V_3$ for both types of disks. The RF signals inputted to the A/D converter circuit 26 are subjected to A/D conversion on the basis of the reference potential $V_3$. The digitized data signals from the A/D converter circuit 26 are applied to and read out by the read out circuit 28.

The clamping circuit composed of the switches 22 and 23 and the reference voltage generator circuits 24 and 25 may be eliminated. In such a case, it is required that the dynamic range of the A/D converter circuit 26 be set to a broader range than in the case where the clamping circuit is employed. That is, the dynamic range of the A/D converter 26 can be made narrower when the clamping circuit is provided.

The time constants of the clamping circuit and the amplifier circuit 3 for the low frequency region are set to sufficiently smaller values than a repetitive period of the servo-byte areas so that the level of the RF signal changes rapidly in response to the operation of the switches 9 and 22.

As described above in the first embodiment of the invention, an AC amplifier is employed for amplifying the RF signal. Thus, the RF signal processing circuit of the invention has an excellent noise characteristics, reduced drift, and lower cost.

According to the RF processing circuit shown in FIG. 2, light reflected from an optical disk (not shown) is detected by the photodetector 1 and then converted into an electrical signal. The RF signal outputted from the photodetector 1 is applied to the amplifier 3 through the capacitor 2 to be amplified therein. The RF signal thus amplified is applied to the capacitor 4 through the edge detector circuit 6. The edge detector circuit 6 compares the RF signal inputted thereto (as shown in FIG. 4(A)) with a predetermined reference level, and detects and edge corresponding to a prepit. A signal from the edge detector circuit 6 is applied to the synchronizing signal detector circuit 7 to detect the synchronizing signal. Based on the detected synchronizing signal, the timing signal generator circuit 8 generates a mirror-surface clamping signal (as shown in FIG. 4(B)) for clamping the RF signal inputted to the edge detector circuit for a predetermined period in an intermediate portion (corresponding to a mirror-surface portion) between two edge pulses constituting the synchronizing signal. The switch 9 is switched to an ON state to clamp the potential of the RF signal from the mirror-surface portion to a reference level (for example, a zero level). Accordingly, even if an AC amplifier is used as the amplifier 3 instead of a DC amplifier having broad bandwidth, information as to the edge position of prepits is accurately obtained by the edge detector circuit 6.

However, in the case where no mirror-surface clamping signal exists, as shown in FIG. 4(D), the above circuit is operated such that the average level of the RF signal is set to a zero level (reference level). As a result, the potential of the RF signal from the mirror-surface portion drops below the zero level (ground level). For example, since the data detection point does not necessarily accurately trace the pits on the disk when the tracking servo loop is open, the change of the level of the RF signal is smaller. Therefore, the level of the RF signal in positions corresponding to pits drops below the reference level so that the pit edges cannot be accurately detected by the edge detector circuit 6.

FIG. 5 shows a circuit diagram of a second embodiment of the RF signal processing circuit of the invention, which overcomes the above disadvantage.

The circuit as shown in FIG. 5 is provided between the amplifier 3 and the edge detector circuit 6 shown in FIG. 2. The corresponding components thereof to those of the circuit shown in FIG. 2 are indicated by the same reference numerals.

The synchronizing signal detector circuit 7 outputs a signal at the level of logic "H" for the period when it detects the synchronizing signal and switches a switch 13 to a connection point H. The timing signal generator circuit 8 generates and outputs mirror-surface clamping signal for the period corresponding to the mirror-surface portion to thereby hold a switch 35 in the ON state. Accordingly, the RF signal outputted from a clamping circuit 31, composed of a capacitor 4 and the switch 35, is applied through a resistor 11, a buffer amplifier 12 and the switch 13 to the edge detector circuit 6. In this case, the RF signal of the mirror-surface portion is clamped to a zero level by the clamping signal.

The detector circuit 7 switches the switch 13 to a connection point L when the synchronizing signal is not present. As a result, the RF signal from the amplifier 12 is outputted through a clamping circuit 32, which is composed of a capacitor 14, diodes 15 and 16, and a resistor 17. The anodes of the diodes 15 and 16 are supplied with predetermined potentials through the resistor 17, and therefore the diode 16 is maintained in a conductive (ON) state. When the potential of the cathode of the diode 15 is increased above that of the anode, the diode 15 is switched to the OFF state. On the other hand, when the potential of the cathode is lowered below that of the anode, the diode 15 is switched to the ON state and the potential thereof is clamped to about the zero level. Accordingly, the minimum level (maximum level when inverted) of the RF signal is clamped to the zero level, thereby to obtain an RF signal substantially similar to that in the case where the clamping circuit 31 is operated.

FIG. 6 is a circuit diagram of a third embodiment of the RF signal processing circuit. In this embodiment, one of clamping circuits 31 and 32 is selected by the switch 13 and then connected to the capacitor 4. Such a circuit construction can decrease the number of components constituting the circuit. In the case of an optical disk in which the reflective index in the recorded portions in data areas increases, the potential of the RF signal in the recorded portions is decreased below that in the mirror-surface portions, as shown in FIG. 7. Accordingly, it is preferable that a synchronizing signal be provided in a control track in which no recording region is present.

According to the above embodiment, a synchronizing signal is clamped to a predetermined potential in periods when the synchronizing signal is detected, and further a minimum or maximum level of the RF signal is clamped to a predetermined potential when no synchronizing signal is detected. As a result, the synchronizing signal can be surely detected.

It is commonly required in reading out data from the respective types of disks that the RF signal be subjected to analog-to-digital conversion on the basis of a predetermined level in order to digitize the RF signal. Conventionally, in order to read data from both types of disks, the level in the synchronizing signal area has been set to the potential of the middle point of the A/D converter circuit, as shown in FIG. 8(C). Accordingly, the RF signal is digitized on the basis of a first level $V_1$ in the case of reproducing data from the former type of disk, as shown in FIG. 8(B). On the other hand, in the case where data from the latter type of disk is reproduced, the RF signal in a preformat portion and recording portion are digitized on the basis of the levels $V_1$ and $V_2$, respectively.

However, setting the level of the synchronizing signal to the middle point of the A/D converter circuit means that A/D conversion is performed with substantially only half the dynamic range of the A/D converter circuit and therefore the resolution is degraded.

FIG. 9 is a block diagram of a fourth embodiment of the RF signal processing circuit of the invention.

In FIG. 9, reference numeral 61 represents an amplifier including, for example, a video-signal amplifying circuit for amplifying an input signal and then outputting two signals, one having the same polarity as and the other the opposite polarity to that of the input signal.

FIG. 10 is a diagram showing a track including a preformat portion and a recording portion on a disk and RF signals reproduced therefrom. Assuming that, according to the reproduction of the recording signals from the preformat portion and the recording portion as shown in FIG. 10(A), the reproduced RF signals from the disk are inputted to the amplifier 61, that is, the RF signal in the recording portion has the opposite polarity to that of the RF signal in the preformat portion, the amplifier 61 outputs both signals having the same and the opposite polarities of the inputted RF signal, as shown in FIG. 10(C) and 10(D). The signals having the same and the opposite polarities are inputted to a switch 66 through capacitor 62 and 63, respectively. Respective first terminals of the switches 64 and 65, the second terminals of which are supplied with a predetermined reference potential and which function as a clamping circuit, are connected to respective first ends of the capacitor 62 and 63, the second ends of which are connected to the switch 66.

Figure 10A:
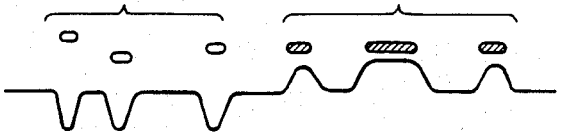
Figure 10C:
Figure 10D:
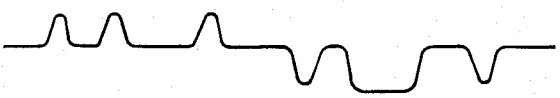
Figure 10F:

The switches 64 and 65 are set in the ON state in response to a clamping signal (as shown in FIG. 10(F)) which is produced based on the timing of a synchronizing signal from a timing circuit (not shown in the drawings) to clamp a synchronizing signal (a signal reproduced from a mirror-surface portion) having the same or opposite polarity to the predetermined reference potential, whereby the level of the reproduced RF signal is prevented from fluctuating.

Figure 10G:
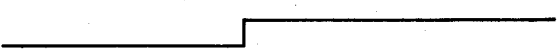

A recording-information-indicating signal indicating the recording portion and a discrimination signal corresponding to the polarity of the RF signal from the recording portion are generated by the timing circuit and applied to AND gate 67. The recording-information-indicating signal is set to a logic "1" during a period corresponding to the recording portion and to a logic "0" during a period corresponding to the preformat portion. The discrimination signal is set to a logic "1" in the case of a disk where the level of the reproduced RF signal in areas including the recording signals in the recording portions is higher than that in areas (mirror-surface portion) including no recording signals, that is, a disk where the polarity of the recording portion is opposite to that of the preformat portion. The discrimination signal is set to a logic "0" in the case of a disk where the level of the reproduced RF signal in an area including recording signals in the recording portions is lower than that in other areas (mirror-surface portions) including no recording signals, that is, a disk where the RF signal of the recording portions has the same polarity as that of the preformat portions. Accordingly, the AND gate 67 constantly outputs a logic "0" for a disk where the RF signal of the recording portion has the same polarity as that of the preformat portion. On the other hand, the AND gate 67 outputs a logic "0" during a period corresponding to the preformat portion and a logic "1" during a period corresponding to the recording portion, as shown in FIG. 10(G) for a disk where the RF signal of the recording portion has the opposite polarity to that of the preformat portion. The switch 66 is switched to the upper terminal in FIG. 9 to be connected to the capacitor 62 when the AND gate 67 outputs a control signal in a logic "0" state, and is switched to the lower terminal in FIG. 9 to be connected to the capacitor 3 when the AND gate 67 outputs a control signal in a logic "1" state. As a result, the switch 66 outputs signals in which the RF signals in the recording portion are consistent in polarity with those in the preformat portion, as shown in FIG. 10(E). The signals thus outputted are subjected to A/D conversion in an A/D converter circuit 8. Accordingly, the middle point of the A/D conversion circuit 8 for digitizing the RF signals can be set to a reference level $V_1$, that is, at such a level that the entire dynamic range can be used.

Figure 11:
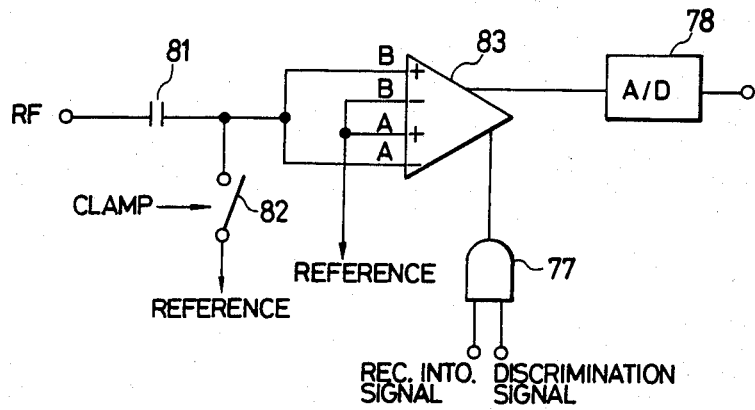
FIG. 11 is a block diagram of a fifth embodiment of an RF signal processing circuit of the invention.

FIG. 11 shows a fifth embodiment of the RF signal processing circuit according to the invention. In this embodiment, an RF signal is inputted through a capacitor 81 to an amplifier 83, and a switch 82 functioning as a clamping circuit is connected to an input terminal of the amplifier 83. In the circuit construction described above, only one clamping circuit can be used. In this embodiment, a video amplifier for amplifying signals of two channels (A and B) is used as the amplifier circuit 83. A positive input terminal of one channel B and a negative input terminal of the other channel A are supplied with the RF signal from the capacitor 81, and a negative input terminal of the channel B and a positive input terminal of the channel A are supplied with a predetermined reference potential.

Figure 12:
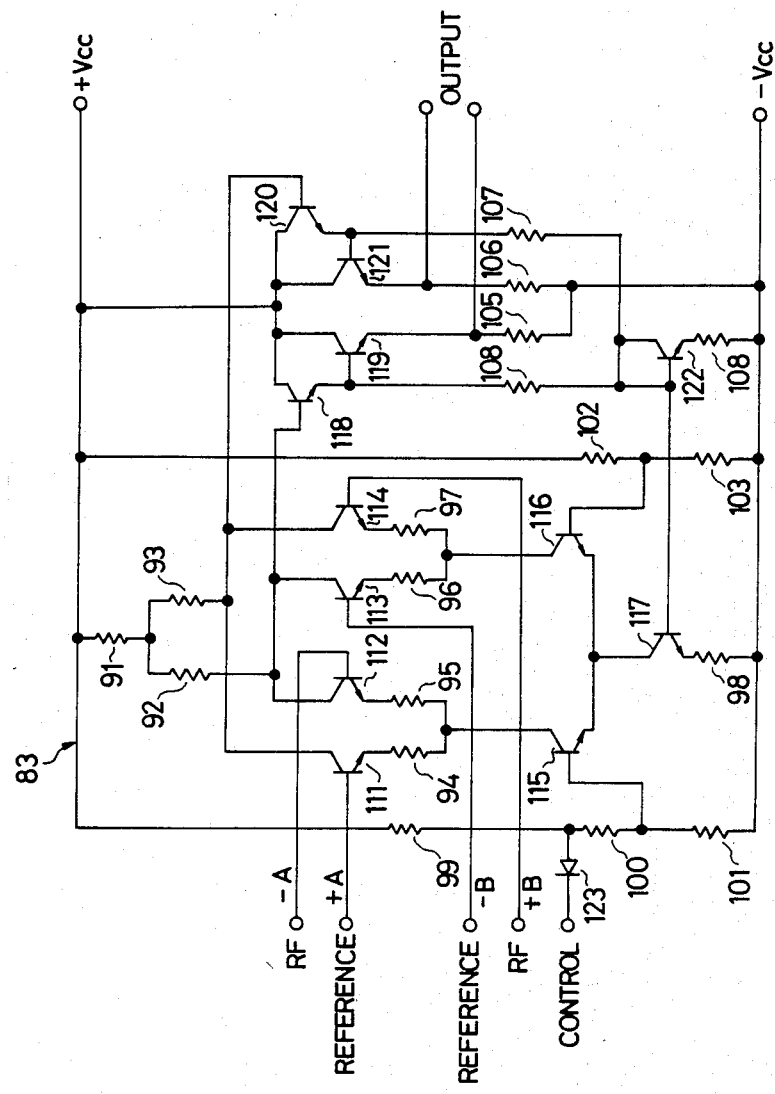
FIG. 12 is a detailed schematic diagram of an amplifier used in the embodiment of FIG. 11.

FIG. 12 is a detailed circuit diagram of the amplifier 83 as shown in FIG. 11. The amplifier includes resistors 91 to 108, NPN-type transistors 111 to 122 and a diode 123.

When a control signal of a logic "0" level is inputted from the AND gate 77 to the diode functioning as a switch, the diode 123 is set in a conductive state (ON state) to thus lower the potential of the base of the transistor 125 through the resistor 100, whereby the differentially connected transistors 115 and 116 are set in the conductive state (ON state). As a result, the constant current flowing through the transistor 117 is applied to the transistor 116 to operate a differential amplifier of the channel B inclusive of the transistors 113 and 114, and the resistors 96 and 97.

When a control signal of a logic "1" level is inputted to the diode 123, the transistors 115 and 116 are set to conductive states (ON states), whereby a constant current flowing in the transistor 117 is applied to the transistor 115 to operate a differential amplifier for the channel A inclusive of the transistors 111 and 112 and the resistors 94 and 95.

An amplified output from the operated channel A or B is produced by an output circuit composed of the transistors 118 to 121 and the resistors 104 to 107. As the RF signal is applied to the positive input terminal of the channel B and the negative input terminal of the channel A, the output of the channel B is the same polarity as the input thereof and the output of the channel A is the opposite polarity to the input thereof.

Figure 13:
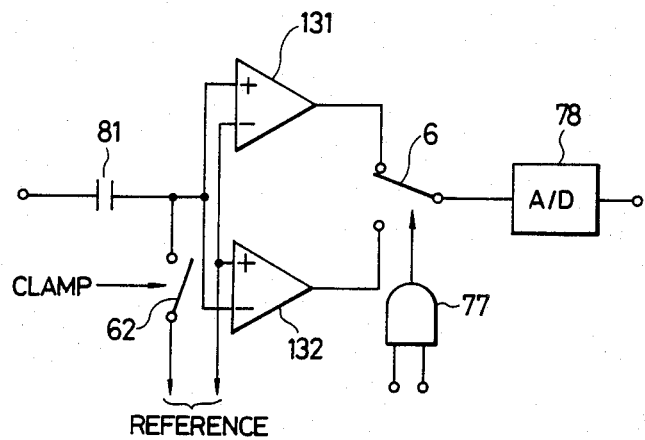
FIG. 13 is a block diagram of a sixth embodiment of an RF signal processing circuit of the invention.

FIG. 13 shows sixth embodiment of the RF signal processing circuit of the invention. In this embodiment, RF signals having the same and opposite polarities as the input RF signal are outputted from amplifiers 131 and 132. Each of the amplifiers 131 and 132 may be a single-channel video amplifier.

According to the above embodiments, the dynamic range of the A/D converter circuit can be more effectively utilized for digitization of the RF signal.

What is claimed is:

1. An RF signal processing circuit comprising:
    amplifying means for AC-amplifying an input RF signal;
    edge detecting means for detecting edges of an output signal from said amplifying means;
    synchronizing signal detecting means for producing a synchronizing signal pulse in response to a predetermined pattern of an output of said edge detecting means;
    timing signal producing means for producing a timing signal having a duration of at least a portion of a period of said synchronization signal pulse; and
    clamping means for clamping an input of said edge detecting means at a predetermined voltage in response to said timing signal.

2. An RF signal processing circuit comprising:
    amplifying means for amplifying an RF signal reproduced from a recording medium having a preformat portion and a recording portion, said amplifying circuit producing both an in-phase and an inverted-phase output signal;
    a clamping circuit for clamping one of an input and output of said amplifying means to a reference potential when said preformat portion is reproduced;

switching means for selecting one of said in-phase and inverted-phase signals so that a polarity with respect to a base level of an RF signal output by said switching means in said recording portion agrees with a polarity with respect to a base level of the RF signal in said preformat portion;

control signal producing means for producing a control signal for controlling said switching means; and A/D converting means for converting to digital form an analog RF signal output by said switching means.

3. An RF signal processing circuit comprising:

first clamping means for clamping a predetermined part of a synchronizing signal portion of an RF signal to a predetermined voltage;

second clamping means for clamping a predetermined one of a minimum and a maximum level of said RF signal to another predetermined voltage; and switching means for selecting an output of said first clamping means when said synchronizing signal is present and an output of said second clamping means when said synchronizing signal is not present.

4. The RF signal processing circuit of claim 1, further comprising:

an A/D converter for converting said RF signal to digital form;

means for determining a type of disk being reproduced; and means for clamping an input to said A/D converter to a level determined in accordance with the type of disk determined by said determining means.

* * * * *